United States Patent
Sekine

(10) Patent No.: US 6,674,094 B2
(45) Date of Patent: Jan. 6, 2004

(54) CMOS IMAGE SENSOR

(75) Inventor: Hirokazu Sekine, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/174,998

(22) Filed: Jun. 20, 2002

(65) Prior Publication Data

US 2003/0010981 A1 Jan. 16, 2003

(30) Foreign Application Priority Data

Jun. 20, 2001 (JP) ........................................ 2001-186893

(51) Int. Cl.$^7$ .................... H01L 29/04; H01L 31/306; H01L 31/62; H01L 33/00; H01L 31/113; H01L 31/00

(52) U.S. Cl. ........................ 257/72; 257/88; 257/440; 257/291

(58) Field of Search .................. 257/72, 88, 291–293, 257/440

(56) References Cited

U.S. PATENT DOCUMENTS

| | | | |
|---|---|---|---|
| 4,602,289 A | | 7/1986 | Sekine |
| 5,144,447 A | * | 9/1992 | Akimoto et al. ............ 348/301 |
| 6,538,693 B1 | * | 3/2003 | Kozuka ....................... 348/241 |
| 6,566,723 B1 | * | 5/2003 | Vook et al. .................. 257/440 |

FOREIGN PATENT DOCUMENTS

JP        60-187187        9/1985

OTHER PUBLICATIONS

Tetsuo Yamada, et al., "A Progressive Scan CCD Image Sensor for DSC Applications", IEEE Journal of Solid–State Circuits, vol. 35, No. 12, Dec. 2000, pp. 2044–2054.

* cited by examiner

Primary Examiner—Cuong Quang Nguyen
(74) Attorney, Agent, or Firm—Oblon, Spivak, McClelland, Maier & Neustadt, P.C.

(57) ABSTRACT

A CMOS image sensor is provided with a first pixel group 12 and a second pixel group 13. The first pixel group 12 composed of a plurality of pixels arranged in a matrix at specified pitches PH and PV in the horizontal and vertical directions, respectively. The second pixel group 13 composed of a plurality of pixels arranged similarly in a matrix shifted by about one-half of the pitches PH and PV in the horizontal and vertical directions, respectively from the matrix of the first pixel group. Each of these pixels is composed of a combination of a photodiode PD, a reset transistor RS, a driver transistor D and an address transistor AD. The reset transistors RS belonging to the first and second pixel groups 12, 13 and arranged in a corresponding row of the matrix are connected to a common reset line RSL. Similarly, the address transistors AD belonging to the first and second pixel groups 12, 13 and arranged in a corresponding row of the matrix are connected to a common address line ADL. Further, drain electrodes of two reset transistors RS contained in adjacent four pixels and drain electrodes of two address transistors are connected to a common reset drain voltage line terminal RD.

20 Claims, 7 Drawing Sheets

CMOS IMAGE SENSOR

BACKGROUND OF THE INVENTION

The present invention relates to a CMOS image sensor that is suited to a solid image pickup device for use in, for example, digital cameras and mobile equipment.

As well known, a CMOS image sensor features easy manufacturing using the CMOS technology that is frequently used for manufacturing semiconductor devices and low power consumption. Further, as peripheral circuit such as a signal processor, etc. can be formed on one chip jointly with a sensing portion, the CMOS image sensor can be manufactured in a small size. Accordingly, this sensor is now attracting attention as an alternate device to CCD that was so far used as an image input device.

A CMOS image sensor that is presently available will be explained below referring to FIG. 1 and FIG. 2. FIG. 1 is a block diagram showing an entire structure of the CMOS image sensor and FIG. 2 is a circuit diagram showing a pixel portion. In FIG. 1 and FIG. 2, a CMOS image sensor 1 contains plural photodiodes Pd providing a pixel 2 and pixel amplifiers 3 connected to plural photodiodes Pd, which are arranged in an almost two dimensional regular grid shape to form a pixel portion 4. On the periphery of the pixel portion 4, a timing generating circuit 5, a vertical line scanning circuit 6, a noise canceling circuit 7, a horizontal line scanning circuit 8 and a reader 10 that has an output amplifier 9 are arranged.

Further, the pixel portion 4 is composed of plural cells Ce11, Ce12, ... Ce21, Ce22, ... that are arranged in an almost two dimensional regular grid shape. Each cell Ceij is composed of one photodiode Pd and 3 transistors; that is, are set transistor Rs, a driver transistor Dr, and an address transistor Ad. These cells Ceij are connected to reset lines RsL1, RsL2, ... address lines AdL1, AdL2, ..., reset drain voltage lines Rd1, Rd2, ... and signal output lines S1, S2, ..., respectively.

The operation of the CMOS image sensor 1 thus arranged will be briefly explained. First, rays of light from an object (not illustrated) is focused on the pixel portion 4 through an optical lens system and an optical image is formed. The photodiodes Pd providing pixels 2 contained in the pixel portion 4 generate electric charge from the focused light through the photoelectric conversion. The generated charge is accumulated for a fixed period in a floating junction Fj that is a connecting portion between a photodiode Pd and a gate of each driver transistor Dr, generating an electric potential corresponding to the light quantity condensed in the pixels 2. The electric potential at the floating junctions Fj becomes a pixel signal.

The potential change in the floating junction Fj is applied to the gate of the driver transistor Dr so as to control the operating state of the driver transistor Dr. That is, reset drain voltage is applied to drain electrodes of the address transistors Ad through reset drain voltage lines Rd and address lines AdL are connected to gate electrodes of the address transistors Ad. When address voltage is ON, the address transistors Ad is placed in the ON state and reset train voltage is applied to the drain electrodes of the driver transistors Dr through this address transistors Ad. Therefore, the driver transistors Dr are put in the operating state and output the voltage corresponding to the electric potential of the gates of the driver transistors Dr to a signal output line S.

The vertical line scanning circuit 6 operates according to the signal from the timing generating circuit 5 and drives plural address lines AdL sequentially by the vertical line scanning circuit 6. In the columns selected through these address lines AdL, pixel signals having signal charge generated in the pixels 2 arranged side by side in the horizontal direction of the lines, for example, photodiodes Pd11, Pd12, ... are generated in signal output lines S1, S2, ... arranged in the horizontal direction. Then, the pixel signals are sent to the noise canceling circuit 7 through the signal output lines S1, S2, ... wherein fixed pattern noises are removed and kept in the noise canceling circuit 7. Thereafter, the signals are time serially read out by the horizontal scanning circuit 8 and output as image signals after amplified by the output amplifier 9.

However, in a conventional CMOS image sensor described above, it is necessary to form two lines in the vertical direction: a signal output line S to output pixel signal and a reset drain voltage line Rd to apply reset drain voltage to the address transistor Ad for each cell Ce that is composed of a photodiode Pd, a reset transistor Rs, a driver transistor Dr and an address transistor Ad.

Similarly, it is also necessary to form two lines in the horizontal direction: a reset line RsL for resetting a floating junction Fj connected to a reset transistor Rs at drain voltage after reading pixel signals and an address line AdL for applying address pulse that is a signal from the vertical line scanning circuit 6 to the address transistor Ad.

By the way, this kind of image sensor is always demanded for a high degree of integration and the achievement of the high level of integration of the pixel portion 4 becomes an issue. For achieving a high level of resolution, it is generally demanded to make photodiodes Pd and transistor elements small in size or to make wires fine. However, there is a limitation on the high level of integration using such method as well as on the improvement of resolution of a conventional CMOS image sensor.

SUMMARY OF THE INVENTION

The present invention is made in view of the above-mentioned circumstances and it is an object to provide an CMOS image sensor that is capable of improving resolution in the horizontal direction as well as the vertical direction by efficiently arranging component elements and wires comprising pixel portions without making component elements and wires small or fine.

A CMOS image sensor according to an embodiment of the present invention has a first pixel group, in which a plurality of pixels composed of a combination of photoelectric conversion elements, reset transistors, driver transistors and address transistors are arranged in a matrix at a prescribed pitch in the horizontal and vertical directions, respectively. The CMOS image sensor further has a second pixel group, in which a plurality of pixels similarly composed of a combination of photoelectric conversion elements, reset transistors, driver transistors and address transistors are arranged in a matrix at a prescribed pitch in the horizontal and vertical directions, respectively, and are dislocated by about one-half of the prescribed pitch in the horizontal and vertical directions from the first pixel group. The CMOS image sensor further has reset lines belonging to the first and second pixel groups and are connected commonly to reset transistors arranged in the corresponding lines extending in the horizontal direction of the matrix arrangement, address lines similarly belonging to the first and second pixel groups and are connected commonly to the address transistors arranged in the corresponding lines extending in the horizontal direction of the matrix arrangement. The CMOS image sensor further has a plurality of first signal output lines belonging to the first pixel group and are connected commonly to the driver transistors arranged in the vertical direction of the matrix arrangement, and a plurality of second signal output lines similarly belonging to the second pixel group and are connected commonly to the driver transistors arranged in the vertical direction of the matrix arrangement.

Further, a CMOS image sensor according to another embodiment of the present invention has a first pixel group, in which a plurality of pixels composed of a combination of photoelectric conversion elements, reset transistors, driver transistors and address transistors are arranged in a matrix at a prescribed pitch in the horizontal and vertical directions, respectively. The CMOS image sensor further has a second pixel group, in which a plurality of pixels similarly composed of a combination of photoelectric conversion elements, reset transistors, driver transistors and address transistors are arranged in a matrix at a prescribed pitch in the horizontal and vertical. directions, respectively, and are dislocated by about one-half of the prescribed pitch in the horizontal and vertical directions from the first pixel group. The CMOS image sensor further contains an integrated circuit pattern, in which the photoelectric conversion elements belonging to the first pixel group and provided adjacent to each other in the horizontal direction and the photoelectric conversion elements belonging to the second pixel group and provided adjacent to each other in the vertical direction are arranged at four corners of a substantial square, a reset drain terminal is arranged at the center of the square.

Further, the driver transistor and the address transistor are arranged at two sides of the square, and the reset transistor and a floating junction that is a connecting portion of the reset transistor with the driver transistor are arranged on the remaining two sides of the square.

DETAILED DESCRIPTION OF THE INVENTION

Preferred embodiments of the present invention will be described below referring to the attached drawings.

Figure 3:
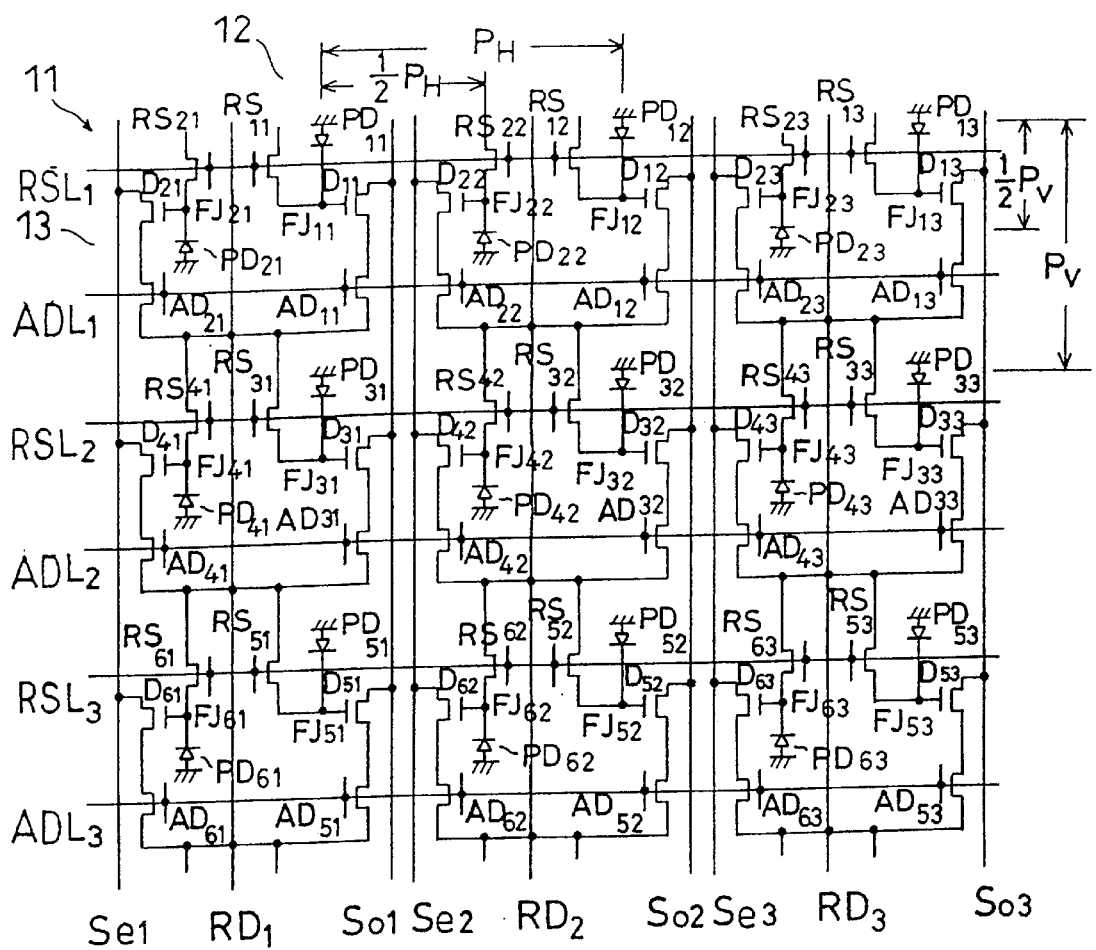
FIG. 3 is a circuit diagram of a pixel portion of a CMOS image sensor in the first embodiment of the present invention.
Figure 4:
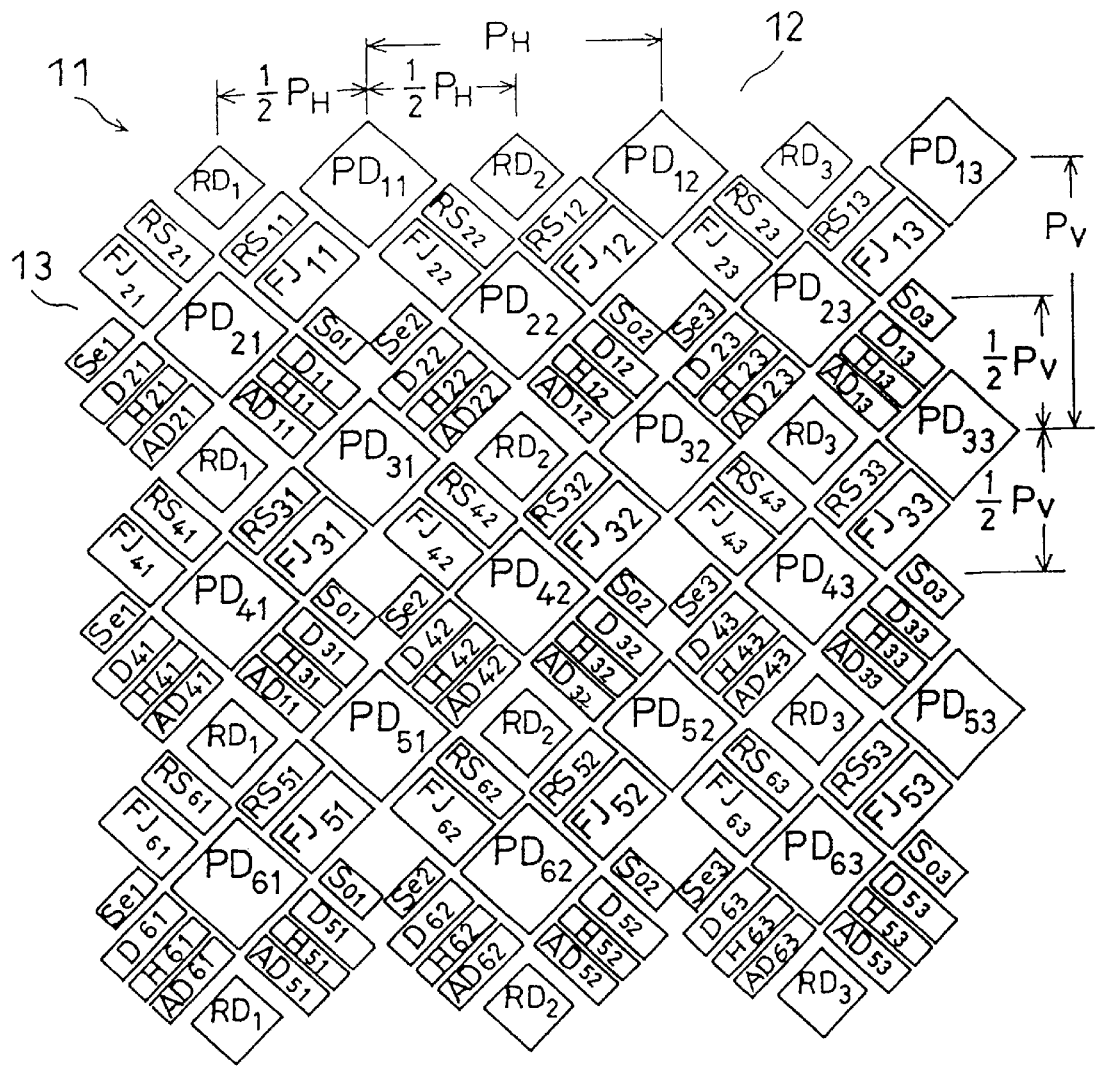
FIG. 4 is a plan view partially showing a circuit pattern when the circuit diagram shown in FIG. 3 is constructed in IC.

A first embodiment of the present invention will be described first referring to FIG. 3 through FIG. 5. FIG. 3 is a circuit diagram of a pixel comprising a CMOS image sensor according to the present invention. FIG. 4 is a plan view showing a pattern of the circuit diagram shown in FIG. 3 constructed in IC, and FIG. 5 is a plan view partially showing this circuit pattern.

Figure 1:
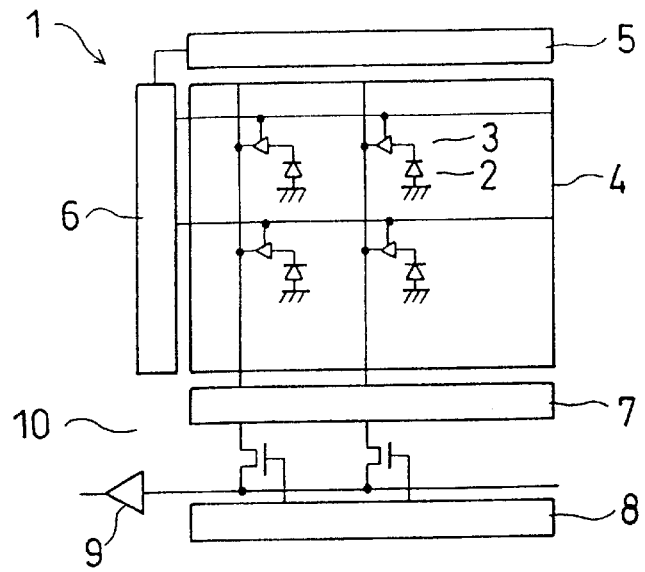
FIG. 1 is a block diagram showing the entire structure of a conventional CMOS image sensor.
Figure 2:
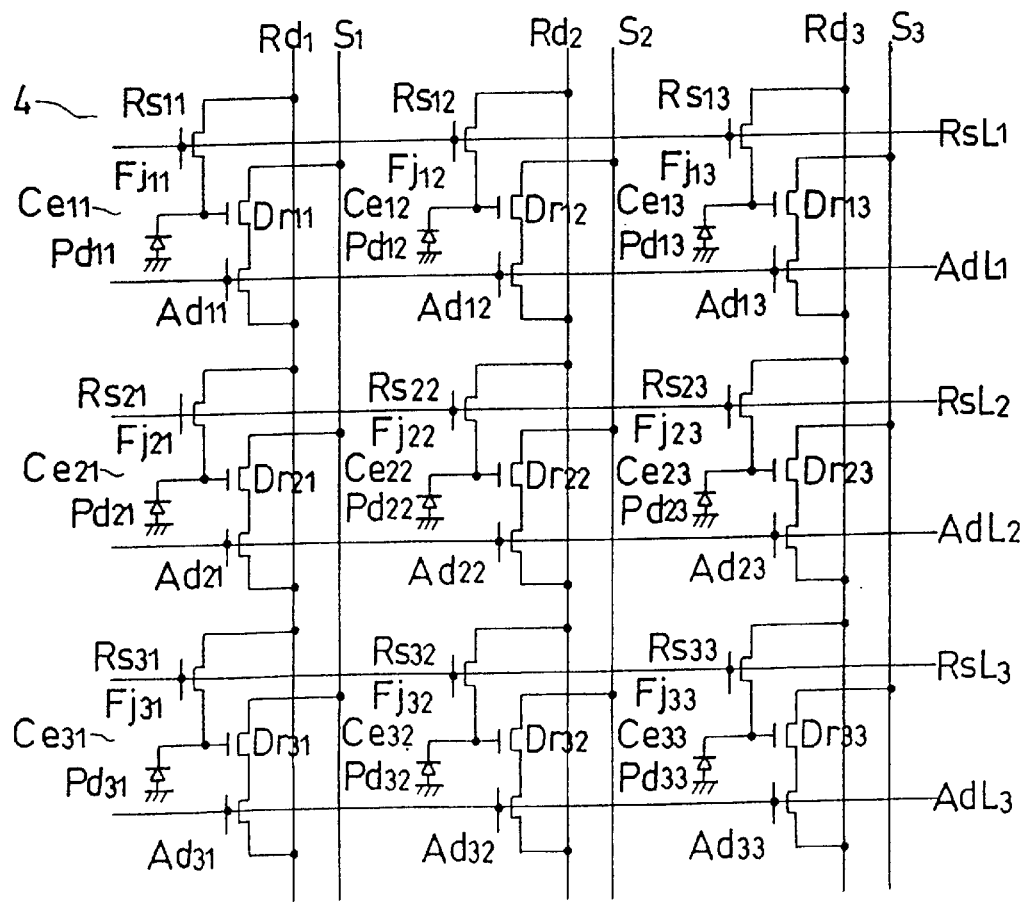
FIG. 2 is a circuit diagram showing the structure of a pixel portion of the CMOS image shown in FIG. 1.
Figure 5:
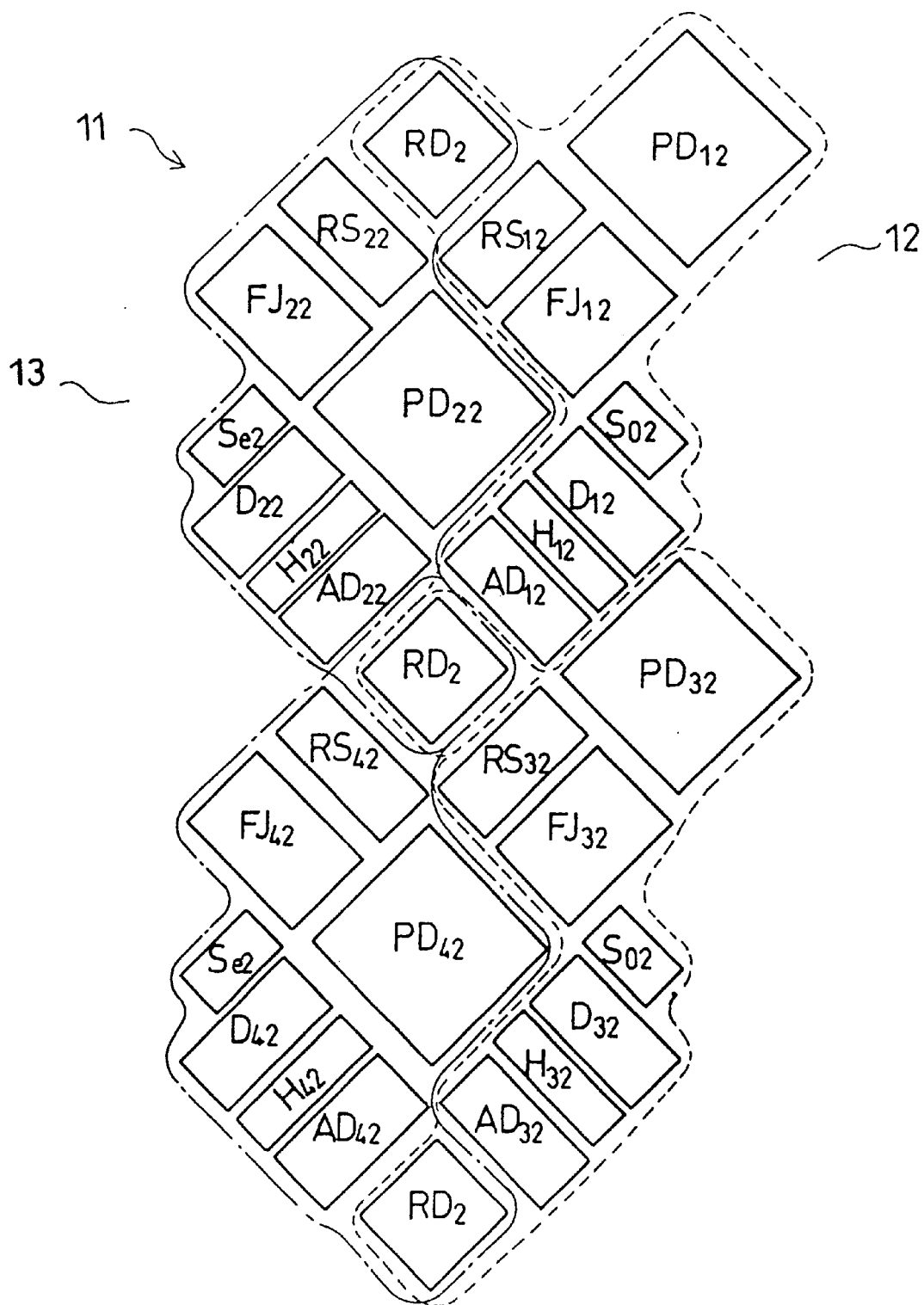
FIG. 5 is a plan view partially showing the circuit pattern shown in FIG. 4.

In FIG. 3 through FIG. 5, a pixel portion 11 is corresponded to the pixel portion 4 of the CMOS image sensor shown in FIG. 1. Although not illustrated, in the peripheral portion of this pixel portion 11, a timing generating circuit, a vertical line scanning circuit, a noise canceling circuit, and a reading portion having a horizontal line scanning circuit are arranged in a same manner as in FIG. 1, and a CMOS image sensor is thus constructed. The pixel portion 11 is composed of a first pixel group 12 and a second pixel group 13. These pixel groups 12, 13 are composed of plural cells arranged in an almost two dimensional regular grid shape as shown in FIG. 1. Each cell is composed of a combination of one photodiode PD, three transistors; that is, a reset transistor RS, a driver transistor D and an address transistor AD.

Further, in the first pixel group 12 and the second pixel group 13, a plurality of photodiodes PD are arranged on the surface of a semiconductor substrate as shown in FIG. 4. Here, photodiodes PD11, PD12, PD13, . . . PD31, PD32, PD33, . . . PD51, PD52, PD53, . . . of the first pixel group and photodiodes PD21, PD22, PD23, . . . PD41, PD42, PD43, . . . PD61, PD62, PD63 . . . , . . . of the second pixel group are arranged in the horizontal direction at pitch Ph and in the vertical direction at pitch Pv forming a matrix in the pixel groups 12, 13, respectively.

The photodiodes PD21, PD22, . . . , PD41, PD42, . . . of the second pixel group 13 are arranged at the positions shifted by ½ pitch in the horizontal and vertical directions from the photodiodes PD11, PD12, . . . , PD31, PD32, . . . of the first pixel group 12 as shown in FIG. 4 and FIG. 5. That is, the photodiodes PD11, PD12, PD13, . . . , PD21, PD22, PD23, . . . , PD31, PD32, PD33, . . . , PD41, PD42, PD43, . . . , PD51, PD52, PD53, . . . , PD61, PD62, PD63 . . . , . . . are arranged to form a checkered pattern.

Next, in the peripheral portion of the photodiodes PD11, PD12, . . . PD31, PD32, . . . , the reset transistors RS11, RS12, . . . , RS31, RS32, . . . , the driver transistor D11, D12, . . . , D31, D32, . . . , the address transistors AD11, AD12, . . . AD31, AD32, . . . are provided. The photodiodes PD11, PD12, . . . , PD31, PD32, . . . and the corresponding driver transistors D11, D12, . . . , D31, D32, . . . are connected with each other through the floating junctions FJ11, FJ12, . . . , FJ31, FJ32, . . . Further, a signal output line So1 extending in the vertical direction is connected to the driver transistors D11, D13, . . . arranged in the vertical direction. Similarly, a signal output line S02 extending in the vertical direction is connected to the driver transistors D12, D32, . . . Further, a signal output line So3, . . . extending in the vertical direction are connected to the driver transistors in the same manner.

On the other hand, in the peripheral portion of the photodiodes PD21, PD22, . . . , PD41, PD42, . . . of the second pixel group 13, there are provided the reset transistors RS21, RS22, . . . , RS41, RS42, . . . , the driver transistors D21, D22, . . . , D41, D42 . . . , and the address transistors AD21, AD22, . . . , AD41, AD42, . . . , respectively. The photodiodes PD21, PD22, . . . , PD41, PD42, . . . are connected to the corresponding driver transistors D21, D22, . . . ,D41, D42, . . . via the floating junctions FJ21, FJ22 . . . FJ41, FJ42, . . . . Further, a signal output line Se1 extending in the vertical direction is connected to the driver transistors D21, D41, . . . arranged in the vertical direction.

Similarly, a signal output line Se2 extending in the vertical direction is connected to the driver transistors D22, D42. In the similar manner, signal output lines Se3, . . . are provided in the vertical direction.

Further, a reset line RSL1 extending in the horizontal direction is provided commonly to the gates of reset transistors RS11, RS12, . . . of the first pixel group 12 and to the gates of reset transistors RS21, RS22, . . . of the second pixel group 13. Further, a reset line RSL2 extending in the horizontal direction is provided commonly to the gates of the reset transistors RS31, RS32, . . . of the first pixel group 12 and to the gates of the reset transistors RS41, RS42, . . . of the second pixel group 13. A reset line RSL3 extending in the horizontal direction is provided commonly to the reset transistors RS51, RS52, . . . , PD61, PD62, . . . in the same manner.

Further, an address line ADL1 extending in the horizontal direction is commonly provided to the gates of the address transistors AD1, AD12, . . . of the first pixel group and to the gates of the address transistors AD21, AD22, . . . of the second pixel group 13. Further, an address line ADL2 extending in the horizontal direction is provided commonly to the gates of the address transistors AD31, AD32, . . . of the first pixel group 12 and to the gates of the address transistors AD41, AD42, . . . of the second pixel group 13. In the similar manner, an address line ADL3 extending in the horizontal direction is provided commonly to the gates of the address transistors AD51, AD52, and AD61, AD62, . . .

Further, common reset drain voltage lines RD1, RD2, RD3, . . . extending in the vertical direction are provided. To the reset drain voltage line RD1, the drain electrodes of the address transistor AD11 of the first pixel group 12 and the drain electrodes of the address transistor AD21 of the second pixel group 13 are commonly connected. To this reset drain voltage line RD1, the drain electrodes of the reset transistor RS31 of the first pixel group 12 and the drain electrodes of the reset transistor RS41 of the second pixel group 13 are commonly connected. Further, to this reset drain voltage line RD1, the drain electrodes of the address transistor AD31 of the first pixel group 12 and the drain electrodes of the address transistor AD41 of the second pixel group 13 are commonly connected. And to this reset drain voltage line RD1, the drain electrodes of the reset transistor RS51 of the first pixel group 12 and the drain electrodes of the reset transistor RS61 of the second pixel group 13 are commonly connected.

Similarly, to the reset drain voltage line RD2, the drain electrodes of the address transistor AD12 of the first pixel group 12 and the drain electrodes of the address transistor AD22 of the second pixel group 13 are commonly connected. To this reset drain voltage line RD2, the drain electrodes of the reset transistor RS32 of the first pixel group 12 and the drain electrodes of the reset transistor RS42 of the second pixel group 13 are commonly connected. Further, to this reset drain voltage line RD2, the drain electrodes of the address transistor AD32 of the first pixel group 12 and the drain electrodes of the address transistor AD42 of the second pixel group 13 are commonly connected. To this reset drain voltage line RD2, the drain electrodes of the reset transistor RS52 of the first pixel group 12 and the drain electrodes of the reset transistor RS62 of the second pixel group 14 are commonly connected.

Similarly, the drain electrodes of respective transistors are commonly connected to the reset drain voltage line RD3, . . .

In FIG. 4 and FIG. 5, plane patterns of the pixel portion having such circuits constructed in IC are shown. That is, the patterns of the photodiodes PD11, PD12, PD13, . . . , PD21, PD22, PD23, . . . ,PD31, PD32, PD33, . . . , PD41, PD42, PD43, . . . , PD51, PD52, PD53, . . . , PD61, PD62, PD63 . . . , . . . are expressed in a square rotated by 45°. These photodiodes are composed of the first pixel group 12 and the second pixel group 13 arranged in the horizontal direction at an equal pitch PH and in the and vertical directions at an equal pitch Pv forming a matrix. These pixel groups 12, 13 are dislocated with each other by ½ pitch in the horizontal and vertical directions and as a result, they are arranged in the checkered pattern as a whole.

In the array of the photodiodes PD11, PD12, PD13, . . . , PD31, PD32, PD33, . . . , PD51, PD52, PD53, . . . arranged in the horizontal direction to form the first pixel group 12, reset drain voltage line terminals RD1, RD2, RD3, . . . that are expressed in a square rotated by 45° are arranged adjacent to respective photodiodes. That is, the reset drain voltage line terminals RD1 and RD2 are arranged at both sides of the photodiode PD11 and the reset drain voltage line terminals RD2 and RD3 are arranged at both sides of the photodiode PD12. Similarly, the reset drain voltage line terminals RD1 and RD2 are arranged at both sides of the photodiode PD31 and the reset drain voltage line terminals RD2 and RD3 are arranged at both sides of the photodiode PD32. Further, the reset drain voltage line terminals RD1 and RD2 are arranged at both sides of the photodiode PD51, and the reset drain line terminals RD2 and RD3 are arranged at both sides of the photodiode PD52.

These reset drain voltage line terminals RD1, RD2, RD3, . . . are not illustrated but are commonly connected to the reset drain voltage lines RD1, RD2. RD3, . . . that are formed on the IC pattern according to the multilayer interconnection and extending in the multiple vertical direction.

Next, the reset transistor RS12 and the floating junction FJ12 are provided between the photodiode PD12 of the first pixel group 12 and the photodiode PD22 of the second pixel group 13. Here, the reset transistor RS12 is so arranged as to position at the reset drain voltage line terminal RD2 side. Further, there are the reset transistor RS32 and the floating junction FJ32 provided between the photodiode PD32 of the first pixel group 12 and the photodiode PD42 of the second pixel group 13. Here, the reset transistor RS32 is arranged so as to position at the reset drain voltage line terminal RD2 side.

Further, there are a driver transistor D12, a floating diffusion area H12 and an address transistor AD12 provided between the photodiode PD32 of the second pixel group and the photodiode PD32 of the first pixel group 12. Here, the address transistor AD12 is arranged to position at the reset drain voltage line terminal RD2 side. Further, the signal output line terminal So2 is provided adjacent to the driver transistor D12 and the floating junction FJ12.

Similarly, between the photodiode PD42 of the second pixel group 13 and the photodiode PF52 of the first pixel group, a driver transistor D32, a floating diffusion area H32 and an address transistor AD32 are provided. Here, the address transistor AD32 is arranged to position at the reset drain voltage line terminal RD2 side. Further, the signal output line terminal So2 is provided adjacent to the driver transistor D32 and the floating junction FJ32. These signal output line terminals So2 are connected to the common signal output line So2 that is not illustrated but formed extending in the vertical direction using the multilayer interconnection.

On the other hand, between the photodiode PD11 of the first pixel group 12 and the photodiode PD22 of the second pixel group 13, the reset transistor RS22 and the floating junction FJ22 are provided. Here, the reset transistor RS22 is arranged at the reset drain voltage line terminal RD2 side. Further, between the photodiode PD31 of the first pixel group 12 and the photodiode PD42 of the second pixel group 13, the reset transistor RS42 and the floating junction FJ42 are provided. Here, the reset transistor RS42 is arranged at the reset drain voltage line terminal RD2 side.

Further, between the photodiode PD22 of the second pixel group 13 and the photodiode PD31 of the first pixel group 12, the driver transistor D22 and the address transistor AD22 are provided with a floating diffusion area H22 between them. Here, the address transistor AD22 is arranged at the reset drain voltage line terminal RD2 side Further, the signal output line terminal Se2 is provided adjacent to the driver transistor D22 and the floating junction FJ22.

Similarly, between the photodiode PD42 of the second pixel group 13 and the photodiode PD51 of the first pixel group 12, the driver transistor D42 and the address transistor AD42 are provided with the floating diffusion area H42 between them. Here, the address transistor AD42 is arranged at the reset drain voltage line terminal RD2 side. Further, the signal output line terminal Se2 is provided adjacent to the drier transistor D42 and the floating junction FJ42. These signal output line terminals Se2 are connected to the common signal output line Se2 that is not illustrated but formed extending in the vertical direction using the multilayer interconnection.

In the plane view of the pixel portion 11 constructed in IC as described above, the following features are observed. That is, as shown in FIG. 1 and FIG. 5, for example, the reset drain voltage line terminal RD2, which is positioned at the center of the square formed by the four photodiodes PD22, PD31, PD32, PD42, is positioned at a point having the shortest distance from the drain electrodes of the address transistor AD12 of the photodiode PD12, the address transistor AD22 of the photodiode PD22, the reset transistor RS32 of the photodiode PD32, and the reset transistor RS42 of the photodiode PD42.

That is, the photodiodes PD31, PD32 arranged adjacent to each other in the horizontal direction of the first pixel group, and the photodiodes PD22, PD42 arranged adjacent to each other in the vertical direction of the second pixel group are provided at 4 corners of the square. At the central portion of the square, there is arranged the reset drain terminal RD2. At two sides of the square, the array of the driver transistors D12, the floating diffusion area H12 and the address transistor AD12 and the array of the driver transistor D22, the floating diffusion area H22 and the address transistor AD22 are provided. At the remaining two sides of the square portion, an array of the reset transistor RS32 and the floating junction FJ32 that is a portion connecting the reset transistor RS32 and the driver transistor D32 and an array of the reset transistor RS42 and the floating junction FJ42 that is a portion connecting the reset transistor RS42 and the driver transistor D42 are provided, respectively.

Further, the drain electrodes of the address transistors AD12, AD22 arranged at two sides of the square portion and the drain electrodes of the reset transistors RS32, RS42 arranged at the remaining two sides of the square portion are connected commonly to the reset drain terminal RD2 arranged at the central portion of the square portion.

In addition, in a square portion adjacent to the square portion, for example, in the square portion with the photodiodes PD31, PD42, PD51, PD41 arranged at its four corners, signal output terminals So and Se are arranged at its central portion. Further, at each side of this square portion, the same elements as those of the above square portion are arranged.

Further, as shown in FIG. 5, when the relation among the four photodiodes PD13, PD22, PD32, PD42 provided near the reset drain voltage line terminal RD2 is viewed, it is featured that the arrayed pattern of the photodiodes PD12, PD22 and accompanied transistors positioned at the upper side and the arrayed pattern of the photodiodes PD32, PD42 and accompanied transistors accompanied positioned at the lower side are the same. Here, a set of the photodiode PD12 and the accompanied transistors and another set of the photodiode PD32 and accompanied transistors are enclosed by dotted lines and are formed in the same pattern. Further, a set of the photodiode PD22 and accompanied transistors and another set of the photodiode PD42 and accompanied transistors are encircled with a chain line, respectively and are formed in the same pattern.

On the other hand, regarding the reset drain voltage terminals RD1, such features as shown below are observed. That is, as shown in FIG. 4, a pattern composed of a photodiode PD11 and PD21 and accompanied transistors adjacent to each reset drain voltage line terminal RD1 is repeated as a unit. That is, a pattern composed of the photodiode PD31, PD41 and accompanied transistors is the same as a pattern composed of the photodiode PD51, PD61 and accompanied transistors, . . . ,which is thus a repeating pattern. This repeated pattern is also observed on other reset drain voltage line terminal RD3, . . . .

Thus forming the pixel portion 11 with photodiodes PD arranged in a checkered pattern as described above, it is possible to commonly use one reset drain voltage line terminal RD for four drain electrodes; that is, they are drain electrodes of two reset transistors RS belonging to the first and second pixel groups 12 and 13 and drain electrodes of two address transistors AD belonging to the first and second pixel groups 12 and 13.

Further, reset lines RSL connected with driver transistors D and address lines ADL connected with address transistors AD are used commonly for two transistors D and AD belonging to the first and second pixel groups 12, 13, respectively. Therefore, the number of reset drain voltage lines RD and reset lines RSL or address lines ADL can be reduced and higher integration can be attained.

Further, by the photodiodes PD arranged in the checkered pattern, the pitch of the photodiodes arranged in the vertical and horizontal directions becomes one half of the photodiodes PD arranged in the grid shape and the degree of integration in the vertical and horizontal directions can be improved. Although resolution in the oblique direction drops in the arrangement, a good performance is available for an ordinary object since resolution of human eye is high in the vertical and horizontal directions and is low in the oblique direction and since ordinary objects contain many components in the vertical and horizontal directions.

Figure 6:
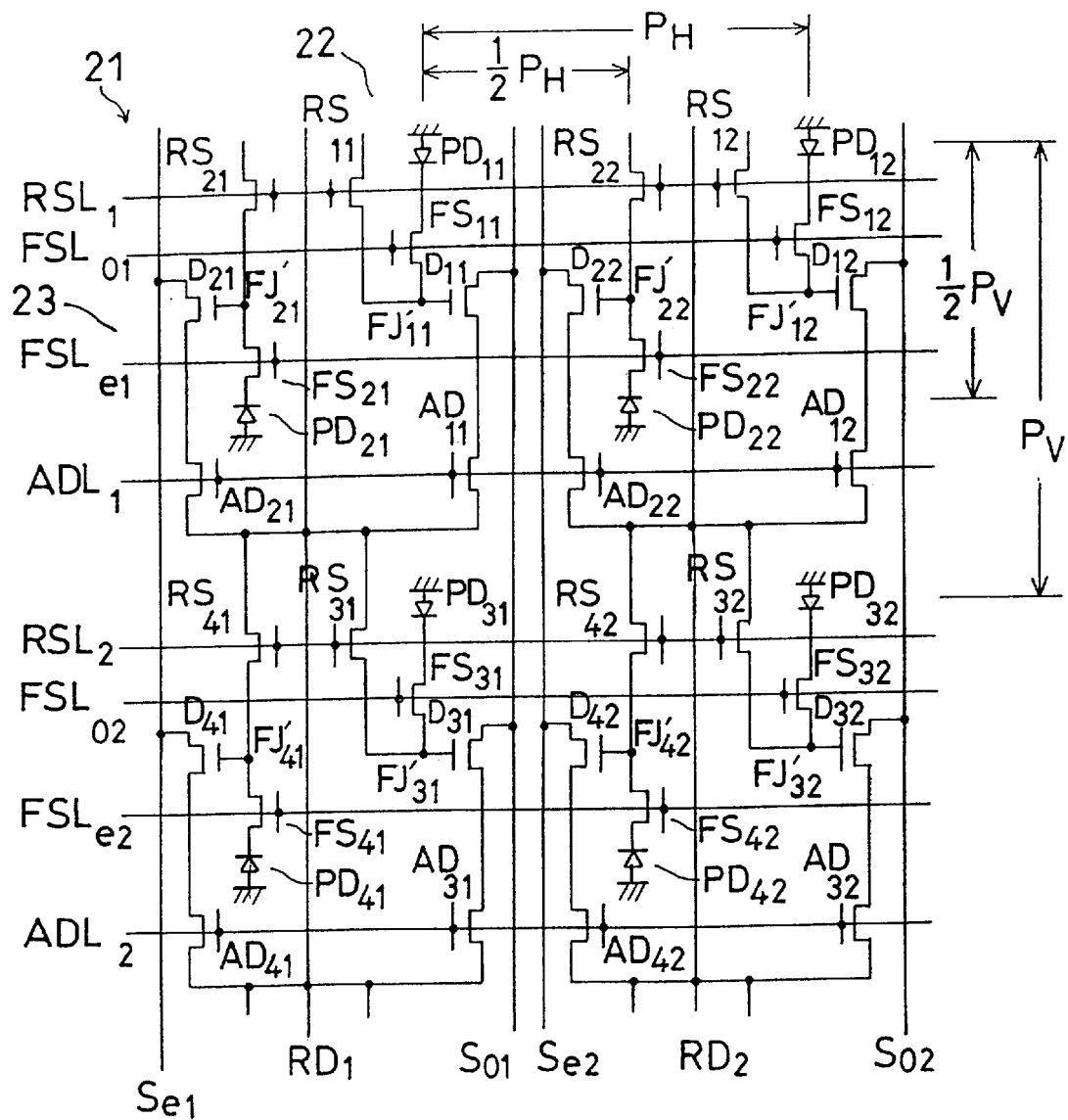
FIG. 6 is a circuit diagram showing the structure of a pixel portion in a CMOS image sensor in the second embodiment of the present invention.
Figure 7:
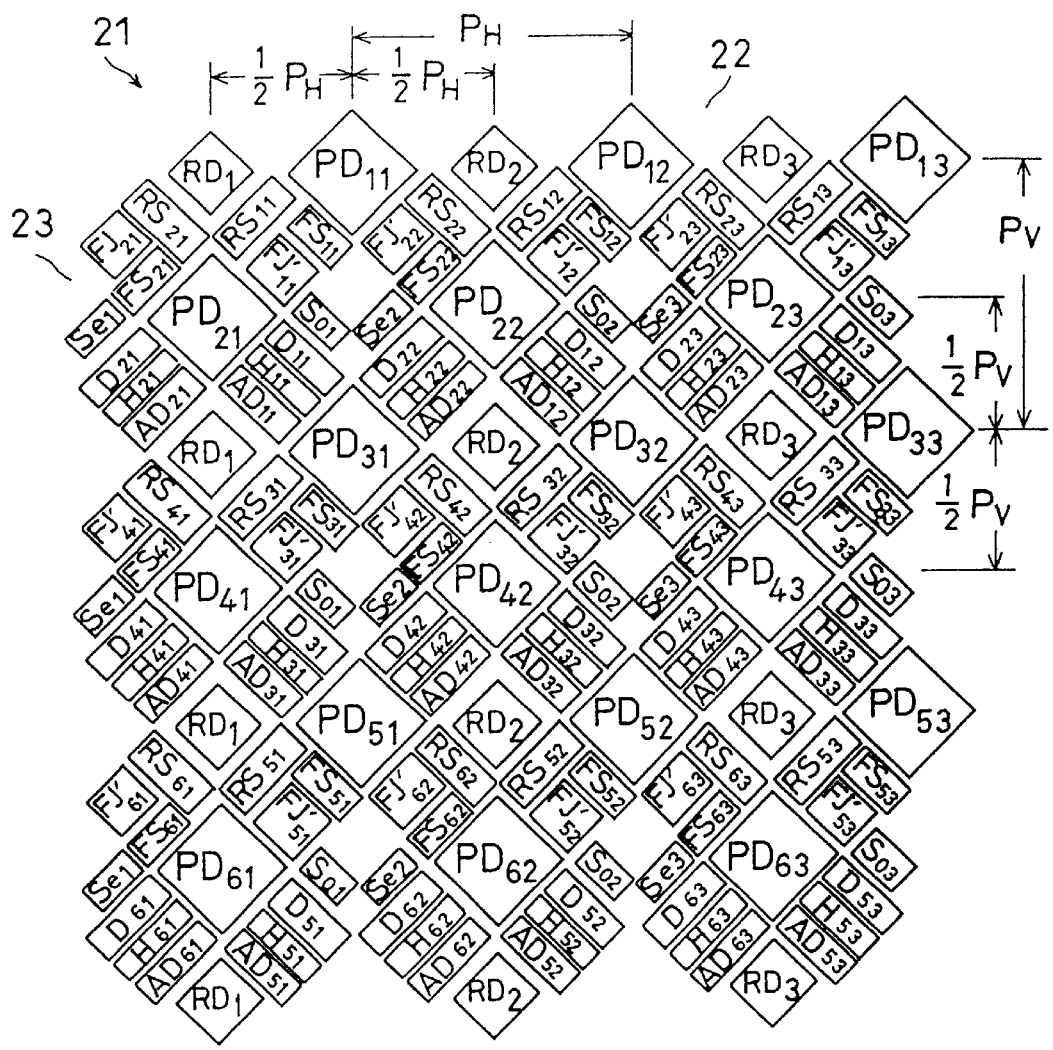
FIG. 7 is a plan view partially showing a circuit pattern when the circuit diagram shown in FIG. 6 is constructed in IC.
Figure 8:
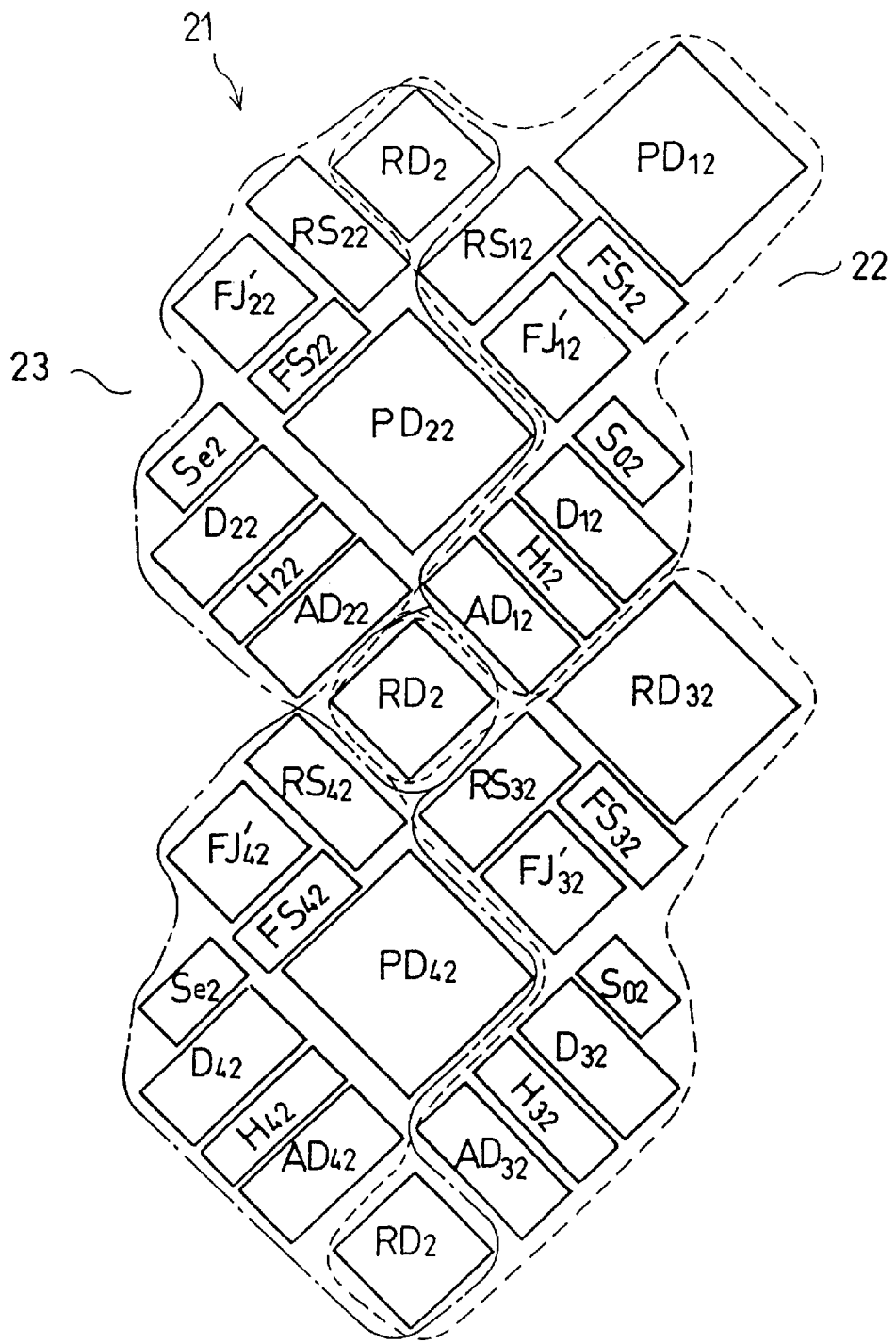
FIG. 8 is a plan view partially showing the circuit pattern shown in FIG. 7.

In the next, a second embodiment according to the present invention will be explained referring to FIG. 6 through FIG. 8. FIG. 6 is a circuit diagram of the pixel portion. FIG. 7 is a plan view showing a circuit pattern of the IC pixel portion. FIG. 8 is a plan view showing a part of FIG. 7. The same portions as those shown in the first embodiment will be assigned with the same reference numerals and the explanations thereof are omitted, and the portions differing from the first embodiment will be explained below.

In FIG. 6 through FIG. 8, a pixel portion 21 corresponds to the pixel portion 4 of the CMOS image sensor 1 shown in FIG. 1. In the peripheral portion of the pixel portion 21, a timing generating circuit, a vertical line scanning circuit, a noise canceling circuit, a horizontal line scanning circuit, and a reading portion that has an output amplifier are arranged likewise FIG. 1, although not illustrated here, forming a CMOS image sensor. The pixel portion 21 is composed of a first pixel group 22 and a second pixel group 23. Each of the pixel groups 22, 23 is composed of plural pixels each of which is a combination of one photodiode PD and four transistors. That is, one pixel is composed of a photodiode PD is accompanied by a field shift transistor FS, a reset transistor RS, a driver transistor D and an address transistor AD.

Further, in the first and second pixel groups 22 and 23, plural photodiodes PD are arranged in a matrix on the surface of a semiconductor substrate, which forms a sensor substrate. Here, the photodiodes PD11, PD12, PD13, ..., PD31, PD32, PD33, ..., ... of the first pixel group 22 and the photodiodes PD21, PD22, PD23, ..., PD41, PD42, PD43 ..., ... of the second pixel group are arranged in a matrix at an equal horizontal pitch Ph and at an equal vertical pitch Pv in the respective pixel groups 22 and 23.

The photodiodes PD21, PD22, ..., PD41, PD42, ... of the second pixel group 23 are arranged at the positions shifted by about ½ pitches in both horizontal and vertical directions from the photodiodes PD11, PD12, ..., PD31, PD32, ... of the first pixel group 22 as shown in FIG. 7. That is, likewise the first embodiment, the photodiodes PD11, PD12, PD13, ..., PD21, PD22, PD23, ..., PD31, PD32, PD33, ..., PD41, PD42, PD43, ..., ... are so arranged as to form a checkered pattern.

Next, in the peripheral portion of the photodiodes PD11, PD12, ..., PD31, PD32, ... of the first pixel group 22, there are provided the field shift transistors FS11, FS12, ..., FS31, FS32, ..., reset transistors RS11, RS12, ..., RS31, RS32, ..., driver transistors D11, D12, ..., D31, D32, ... and address transistors AD11, AD12, ..., . The photodiodes PD11, PD12, ..., PD31, PD32, ... are connected to the driver transistors D1, D12, ..., D31, D32, ... through the field shift transistors FS11, FS12, ..., FS31, FS32, ..., and floating junctions FS'11, FJ'12, ..., FJ'31, FJ'32, ... Further, the signal output line So1 is connected to the driver transistors D11, D31, ... that are lined in the vertical direction. Similarly, the signal output line So2 is connected to the driver transistors D12, D32, ... and the signal output line So3 is connected in the same manner.

On the other hand, in the peripheral portion of the photodiodes PD21, PD22, ..., PD41, PD42, ... of the second pixel group 23, the field shift transistors FS21, FS22, ..., FS41, FS42, ..., reset transistors RS21, RS22, ..., RS41, RS42, ..., and address transistors AD21, AD22, ..., AD41, AD42, ... are provided correspondingly. The photodiodes PD21, PD22, ..., PD41, PD42, ... are connected to the driver transistors D21, D22, ..., D41, D42, ... through the field shift transistors FS21, FS22, ..., FS41, FS42, ..., and floating junctions FJ'21, FJ'22, ..., FJ'41, FJ42', .... Further, the signal output line Se1 extending in the vertical direction is connected to the driver transistors D21, D41, ... lined in the vertical direction. Similarly, the signal output line Se2 extending in the vertical direction is connected to the driver transistors D22, D42, ... and the signal output line Se3 extending in the vertical direction is provided.

Further, for the field shift transistors FS11, FS12, ..., FS31, FS32, ... belonging to the first pixel group 22 and the field shift transistors FS21, FS22, ..., FS41, FS42, ... belonging to the second pixel group 23, the field shift lines FSLo1, FSLo2, ..., FSLe1, FSLe2, ... extending in the horizontal direction are commonly connected to the gates of these transistors. In addition, for the reset transistors RS11, RS12, ..., RS31, RS32, ... belonging to the first pixel group 22 and the reset transistors RS21, RS22, ..., RS41, RS42, ... belonging to the second pixel group 23, the reset lines RSL1, RSL2, ... extending in the horizontal direction similarly are commonly connected to the gates of these transistors.

Further, the address lines ADL1 extending in the horizontal direction is provided commonly to the gates of the address transistors AD11, AD12, ... belonging to the first pixel group 22 and the gates of the address transistors AD21, AD22, ... belonging to the second pixel group 23. Similarly, for the address transistors AD31, AD32, ... and the address transistors AD41, 42, ..., the address line ADL2 extending similarly in the horizontal direction are commonly provided. Although not illustrated, the same construction is repeated.

Further, the common reset drain voltage lines RD1, RD2, RD3, ... extending in the vertical direction are provided. The drain electrode of the address transistor AD11 belonging to the first pixel group 22 and the drain electrode of the address transistor AD21 belonging to the second pixel group 23 are connected commonly to the reset drain voltage line RD1. In addition, to this reset drain voltage line RD1, the drain electrode of the reset transistor RS31 belonging to the first pixel group 22 and the drain electrode of the reset transistor RS41 belonging to the second pixel group 23 are commonly connected. Similarly, the drain electrodes of the address transistors AD12 and AD22, and the drain electrodes of the reset transistors RS32 and RS42 are commonly connected to the reset drain voltage line RD2.

In FIG. 7 and FIG. 8, plane patterns of the pixel portion 21 are shown having the above circuits formed in integrated circuits. That is, the patterns of the photodiodes PD11, PD12, PD13, ..., PD21, PD22, PD23, ..., PD31, PD32, PD33, ..., PD41, PD42, PD43, ..., PD51, PD52, PD53, ..., PD61, PD62, PD63, ..., ... are represented by a squares rotated by 45° likewise the first embodiment. These photodiodes are composed of the first and second pixel groups 12 and 13 arranged in the matrix at equal pitches PH and Pv in the horizontal and vertical directions. These pixel groups 12, 13 are shifted each other by ½ pitch in the horizontal and vertical directions. As a result, they are arranged in a checkered pattern shape as a whole.

The IC patterns and other portions shown in FIG. 7 and FIG. 8 are almost the same as the circuit patterns shown in FIG. 4 and FIG. 5 except for the following points. That is, the floating junctions FJ'11, FJ'12, ..., FJ'21, FJ'22, ..., FJ'31, FJ'32, ..., FJ'41, FJ'42 in the second embodiment are in the square patterns having a reduced area and rotated by almost 45° compared to the corresponding floating junctions FJ11, FJ12, ..., FJ21, FJ22, ..., FJ31, FJ32, ..., FJ41, FY42, ... in the first embodiment. In the spaces thus formed by the reduction of area, the field shift transistors FS11, FS12, ..., FS21, FS22, ..., FS31, FS32, ..., FS41, FS42, ... are arranged, each of which is formed in a rectangular pattern rotated by about 45°. The gate electrodes of these field shift transistors are connected to the field shift lines FSLo1, FSLo2, ..., FSLe1, FSLe2, ... that are arranged in the horizontal direction. Further, these field shift lines (not shown) are formed in the laminated layer on the circuit pattern shown in FIG. 7 using the multilayer interconnection technology.

Thus, the second embodiment differs from the first embodiment in that the field shift transistors FS11, FS12, ..., FS21, FS22, ..., FS31, FS32, ..., FS41, FS42, ... are provided corresponding to the floating junctions FJ'11, FJ'12, ..., FJ'21, FJ'22, ..., FJ'31, FJ'32, ..., FJ'41, FJ'42, .... As shown in FIG. 6, ON/OFF operation of these field shift transistors FS11, FS12, ..., FS21, FS22, ... FS31, FS32, ..., FS41, FS42, ... are controlled through the field shift line FSLo1, FSLo2, ..., FSLe1, FSLe2, .... For example, when the filed shift transistors FS11, FS12, ... are in the OFF state by the field shift line FSLo1, the photodiodes PD11, PD12, PD13, ... are read and output signals obtained through the signal output lines So1, So2, ... are stored in storage elements (not shown). The output signals obtained through the signal output lines So1, So2, ... are not potential signals based on electric charges generated from the photodiodes PD11, PD12, ... but noise signals accumulated in the floating junctions FJ'11, FJ'12, .... When the field shift transistor FS11, FS12, ... are in the ON state by the field shift line FSLo1, the photodiodes PD11, PD12, ... are read and output signals are obtained through the signal output lines So1, So2, .... Differences of these output signals from the output signals stored in the storage elements become true read out signals from the photodiodes PD11, PD12, .... Thus, noiseless output signals can be obtained from the photodiodes PD11, PD12, ....

In the second embodiment described above, the reset drain voltage line terminal RD becomes common to drains of four transistors RS and AD arranged in its peripheral portion likewise the first embodiment. The reset lines RSL and address lines ADL also become common to adjacent transistors D, AD of the first and second pixel groups 22 and 23, and the degree of integration of IC circuits can be improved by reducing the number of lines. In addition, resolution in the vertical as well as horizontal directions can be improved when photodiodes are arranged in a checkered pattern.

Further, in the above embodiments, it is possible to omit the floating diffusion areas H provided between the driver transistors D and the address transistors AD and to provide the gates of the driver transistors D and the address transistors AD adjacently to each other like multiple transistors.

Further, the pixel portions may be formed using MOS capacitors instead of the photodiodes in the pixel portions 11, 21 of the above embodiments.

As it is clear from the above description, the present invention enables to efficiently arrange component elements and lines comprising the pixel portions and thus to improve the density of integration without reducing the size of the component elements or width of the wires. As a result, resolution can be improved both in the horizontal and vertical directions.

What is claimed is:

1. A CMOS image sensor comprising:
   a first pixel group, in which a plurality of pixels composed of a combination of photoelectric conversion elements, reset transistors, driver transistors and address transistors are arranged in a matrix at a prescribed pitch in the horizontal and vertical directions, respectively;
   a second pixel group, in which a plurality of pixels similarly composed of a combination of photoelectric conversion elements, reset transistors, driver transistors and address transistors are arranged in a matrix at a prescribed pitch in the horizontal and vertical directions, respectively, and are dislocated by about one-half of the prescribed pitch in the horizontal and vertical directions from the first pixel group;
   reset lines commonly connected to the reset transistors belonging to the first and second pixel groups and arranged in the corresponding horizontal rows in the matrix;
   address lines commonly connected to the address transistors belonging to the first and second pixel groups and arranged in the corresponding horizontal rows in the matrix arrangement;
   a plurality of first signal output lines commonly connected to the driver transistors belonging to the first pixel group and arranged in the corresponding vertical columns in the matrix; and
   a plurality of second signal output lines commonly connected to the driver transistors belonging to the second pixel group and arranged in the corresponding vertical column in the matrix arrangement.

2. A CMOS image sensor according to claim 1, wherein
   a plurality of reset drain voltage lines provided in the vertical direction corresponding to the columns in the matrix arrangement are further provided,
   drain electrodes of said reset transistors belonging to the first pixel group and arranged in the columns in the matrix arrangement and and drain electrodes of the reset transistors belonging to the second pixel group and arranged in columns adjacent to said columns in the matrix of the first pixel group are commonly connected to said reset drain voltage lines, and
   drain electrodes of the address transistors belonging to the first pixel group and arranged in columns in the vertical direction and drain electrodes of the address transistors belonging to the second pixel group and arranged in the column adjacent to the columns in first pixel group are commonly connected to said reset drain voltage lines.

3. A CMOS image sensor according to claim 2, wherein the driver transistors and the address transistors forming the pixels are connected in series, the photoelectric conversion elements are connected to gate electrodes of the driver transistors, and source electrodes of the reset transistors are connected to gate electrodes of the driver transistors.

4. A CMOS image sensor according to claim 2, wherein the photoelectric conversion elements are photodiodes.

5. A CMOS image sensor according to claim 2, wherein the photoelectric conversion elements are connected to the gate electrodes of the driver transistors via field shift transistors.

6. A CMOS image sensor according to claim 3, wherein the photoelectric conversion elements are connected to the gate electrodes of the driver transistors through the field shift transistors.

7. A CMOS image sensor according to claim 4, wherein the photodiodes are connected to the gate electrodes of the driver transistors through the field shift transistors.

8. A CMOS image sensor formed in an integrated circuit comprising:
   a first pixel group, in which a plurality of pixels composed of a combination of photoelectric conversion elements, reset transistors, driver transistors and address transistors are arranged in a matrix at a prescribed pitch in the horizontal and vertical directions, respectively;
   a second pixel group, in which a plurality of pixels similarly composed of a combination of photoelectric conversion elements, reset transistors, driver transistors and address transistors are arranged in a matrix at a prescribed pitch in the horizontal and vertical directions, respectively, and are dislocated by about one-half of the prescribed pitch in the horizontal and vertical directions from the first pixel group; wherein the photoelectric conversion elements of the first pixel group arranged adjacent to each other in the horizontal direction and the photoelectric conversion elements of the second pixel group arranged adjacent to each other in the vertical direction are arranged at four corners of an square and the reset drain terminals are arranged at nearly the center of the square, the driver transistors and the address transistors are arranged at two sides of the square, respectively, and the reset transistors and the floating junctions that are the connecting portions between the reset transistors and the driver transistors are arranged at the remaining two sides of the square.

9. A CMOS image sensor according to claim 8, wherein the drain electrodes of the address transistors arranged at two sides of the square and the drain electrodes of the reset transistors arranged at the remaining two sides of the square are commonly connected to the reset drain terminal provided nealy at the center of the square.

10. A CMOS image sensor according to claim 8, wherein the address transistors arranged at two sides of the square and the reset transistors arranged at the remaining two side of the square are arranged at nearly the center of the square.

11. A CMOS image sensor according to claim 10, wherein the photoelectric conversion elements are formed in a square pattern rotated about 45° and the reset drain terminals are formed in a square pattern rotated about 45°.

12. A CMOS image sensor according to claim 11, wherein the photoelectric conversion elements are photodiodes.

13. A CMOS image sensor according to claim 12, wherein the field shift transistors are arranged adjacent to the floating junctions.

14. A CMOS image sensor according to claim 8 further including an integrated circuit pattern, wherein the photoelectric conversion elements of the second pixel group adjacently arranged in the horizontal direction and the photoelectric conversion elements of the first pixel group adjacently arranged in the vertical direction are provided at four corners of a square, the first and second signal output line terminals are provided nearly at the center of the square, the driver transistors and the address transistors are provided at two sides of the square, and the reset transistors and the floating junctions that are the connecting portion between the reset transistors and the driver transistors are provided at the remaining two sides of the square.

15. A CMOS image sensor according to claim 14, wherein the field shift transistors are arranged adjacent to the floating junctions.

16. A CMOS image sensor according to claim 15, wherein the address transistors arranged at two sides of the square and the reset transistors arranged at remaining two sides of the square are arranged nearly at the center of the square.

17. A CMOS image sensor according to claim 16, wherein a plurality of reset drain voltage lines are provided, which are formed using a multi-layer interconnection and are extending in the vertical direction corresponding to the column in the matrix arrangement of the pixel portion, and wherein the reset drain voltage terminals of the first and second pixel groups arranged in adjacent columns in the matrix are commonly connected to the reset drain voltage lines.

18. A CMOS image sensor according to claim 17, wherein a plurality of signal output lines are provided, which are formed using a multi-layer interconnection and are extending in the vertical direction corresponding to the column in the matrix arrangement of the pixel portion, and wherein the signal output line terminals of the first and second pixel groups arranged in each column in the respective matrix are commonly connected to the corresponding signal output lines.

19. A CMOS image sensor according to claim 18, wherein a plurality of reset lines are provided, which are formed using a multi-layer interconnection and are extending in the horizontal direction corresponding to the row in the matrix arrangement of the pixel portion, and wherein the reset transistors of the first and second pixel groups arranged in adjacent rows in the matrix are commonly connected to the reset drain voltage lines.

20. A CMOS image sensor according to claim 19, wherein a plurality of address lines are provided, which are formed using a multi-layer interconnection and are extending in the horizontal direction corresponding to the row in the matrix arrangement of the pixel portion, and wherein the address transistors of the first and second pixel groups arranged in adjacent rows in the matrix are commonly connected to the address lines.

* * * * *